United States Patent
Hung et al.

(10) Patent No.: US 12,009,657 B2
(45) Date of Patent: Jun. 11, 2024

(54) ESD CLAMP CIRCUIT FOR LOW LEAKAGE APPLICATIONS

(71) Applicant: Taiwan Semiconductor Manufacturing Company, Ltd., Hsinchu (TW)

(72) Inventors: Tao Yi Hung, Hsinchu (TW); Wun-Jie Lin, Hsinchu (TW); Jam-Wen Lee, Hsinchu (TW); Kuo-Ji Chen, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 206 days.

(21) Appl. No.: 17/577,951

(22) Filed: Jan. 18, 2022

(65) Prior Publication Data

US 2023/0009740 A1   Jan. 12, 2023

Related U.S. Application Data

(60) Provisional application No. 63/219,918, filed on Jul. 9, 2021.

(51) Int. Cl.
*H02H 9/04* (2006.01)
*H02H 1/00* (2006.01)

(52) U.S. Cl.
CPC .......... *H02H 9/046* (2013.01); *H02H 1/0007* (2013.01)

(58) Field of Classification Search
CPC ............ H01L 27/0248–0296; H02H 9/04–046
See application file for complete search history.

(56) References Cited

U.S. PATENT DOCUMENTS

| 7,529,070 B2 * | 5/2009 | Bhattacharya | ...... H01L 27/0266 |
| | | | 361/111 |
| 9,373,612 B1 * | 6/2016 | Huang | ................ H01L 27/0288 |

(Continued)

FOREIGN PATENT DOCUMENTS

| CN | 109872991 A | 6/2019 |
| TW | 200705641 A | 2/2007 |

(Continued)

*Primary Examiner* — Jared Fureman
*Assistant Examiner* — Christopher J Clark
(74) *Attorney, Agent, or Firm* — MERCHANT & GOULD P.C.

(57) ABSTRACT

An ESD clamp circuit has an ESD detection circuit connected between a first terminal and a second terminal, with a first output node and a second output node. The ESD detection circuit is configured to output respective first and second control signals at the first and second output nodes in response to an ESD event. A discharge circuit includes a p-type transistor having a source, a drain and a gate, with the gate connected to the first output node. An n-type transistor has a source, a drain and a gate, with the gate connected to the second output node. The drain is connected to the drain of the p-type transistor. The discharge circuit is configured to establish a first ESD discharge path from the first terminal, through the p-type transistor and the n-type transistor, to the second terminal, and to further establish a second ESD discharge path in parallel with the first ESD discharge path. The second ESD discharge path includes a parasitic silicon controlled rectifier (SCR).

20 Claims, 9 Drawing Sheets

(56) References Cited

U.S. PATENT DOCUMENTS

| | | | | |
|---|---|---|---|---|
| 10,177,137 | B1* | 1/2019 | Altolaguirre | H01L 27/0281 |
| 2007/0183104 | A1* | 8/2007 | Tseng | H01L 27/0285 |
| | | | | 361/56 |
| 2008/0197415 | A1* | 8/2008 | Yun | H02H 9/046 |
| | | | | 257/E29.217 |
| 2010/0148797 | A1* | 6/2010 | Ker | H02H 9/046 |
| | | | | 324/555 |
| 2012/0081820 | A1* | 4/2012 | Chu | H02H 9/046 |
| | | | | 361/56 |
| 2013/0050885 | A1* | 2/2013 | Chen | H02H 9/04 |
| | | | | 361/56 |
| 2013/0265676 | A1* | 10/2013 | Prabhu | H02H 9/046 |
| | | | | 361/56 |
| 2013/0293993 | A1* | 11/2013 | Chen | H01L 27/0285 |
| | | | | 361/56 |
| 2014/0307354 | A1* | 10/2014 | Watanabe | H02H 9/046 |
| | | | | 361/56 |
| 2015/0249334 | A1* | 9/2015 | Chen | H02H 9/046 |
| | | | | 361/56 |
| 2017/0346277 | A1* | 11/2017 | Su | H01L 27/0285 |
| 2021/0257353 | A1* | 8/2021 | Chen | H01L 27/0266 |
| 2022/0384420 | A1* | 12/2022 | Ikeda | H01L 27/0266 |
| 2023/0009740 | A1* | 1/2023 | Hung | H02H 9/046 |

FOREIGN PATENT DOCUMENTS

| | | |
|---|---|---|
| TW | 200945540 A | 11/2009 |
| TW | 201232757 A | 8/2012 |
| TW | 201947730 A | 12/2019 |

* cited by examiner

ESD CLAMP CIRCUIT FOR LOW LEAKAGE APPLICATIONS

PRIORITY CLAIM AND CROSS-REFERENCE

This application claims priority to U.S. Provisional Application No. 63/219,918, filed Jul. 9, 2021, the disclosure of which is hereby incorporated by reference in its entirety.

BACKGROUND

Protection of integrated circuits (IC) devices from electrostatic discharge (ESD) is desirable, since ESD can cause substantial damage to such devices. A clamp circuit may be used in an ESD protection network, sometimes referred to as an "ESD power-rail clamp circuit" or "ESD clamp circuit." A clamp circuit may reduce or prevent circuit failure by bypassing positive or negative ESD current through a low resistance path during ESD events. Generally, an ESD clamp circuit includes an ESD detection circuit and a discharge device. The clamp circuit shows high impedance during a standby mode and low impedance during ESD events

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Protection of integrated circuits (IC) devices from electrostatic discharge (ESD) is desirable, since ESD can cause substantial damage to such devices. An "ESD power-rail clamp circuit" or "ESD clamp circuit" is an ESD protection circuit that may reduce or prevent circuit failure by bypassing positive or negative ESD current through a low resistance path in response to detection of an ESD pulse. Generally, an ESD clamp circuit includes an ESD detection circuit that detects the ESD pulse and a discharge device that provides the ESD discharge path. The clamp circuit shows high impedance during a standby mode and low impedance during ESD events.

Some ESD clamp circuits may employ a voltage divider (e.g. a resistive voltage divider) to provide desired voltage biases for circuit devices in the ESD detection and discharge circuits. However, power consumption may be increased with such arrangements due to leakage contributed from the voltage divider. Moreover, the voltage divider circuit increases chip area used for the ESD clap circuit.

In accordance with aspects of the present disclosure, an ESD clamp circuit is provided that may forego use of a resistive voltage divider for biasing devices in the clamp circuit. The ESD clamp circuit addresses circuit failure by bypassing a transient ESD pulse through an ESD discharge path during ESD events (i.e., when ESD occurs). The ESD clamp circuit shows a high impedance during a standby mode and a low impedance during an ESD mode. Further, a parasitic P-N-P-N silicon-controlled rectifier (SCR) is turned on in the ESD mode and serves as an additional ESD discharge path. As such, the ESD clamp circuit can shunt the transient ESD pulse in the ESD mode. In addition to eliminating leakage caused by a resistive voltage divider, each of the transistors in the ESD clamp circuit is in its lowest-leakage-current state in the standby mode, therefore further reducing the overall leakage current in the standby mode.

Figure 1:
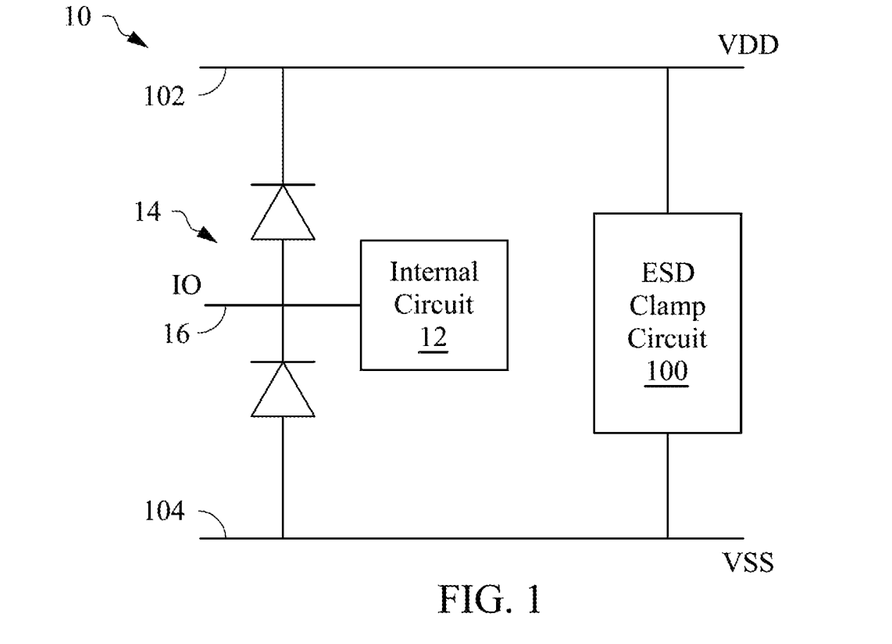
FIG. 1 is a block diagram illustrating an example IC including an ESD clamp circuit in accordance with some embodiments.

FIG. 1 illustrates aspects of an integrated circuit device 10 in accordance with disclosed examples. The illustrated example device 10 includes an internal circuit 12 connected to an I/O circuit 14, that includes an I/O terminal 16. The IO circuit 14 is coupled between a first rail or terminal 102 and a second rail terminal 104. In the example of FIG. 1, the first terminal 102 is a VDD terminal that receives a first voltage VDD, while the second terminal 104 is a VSS terminal receives a second voltage VSS, which is ground in some examples. The IC device 10 further includes an ESD clamp circuit 100 (which will be described further below), which is coupled between the first terminal 102 and the second terminal 104 to selectively provide an ESD path during ESD events.

Figure 2:
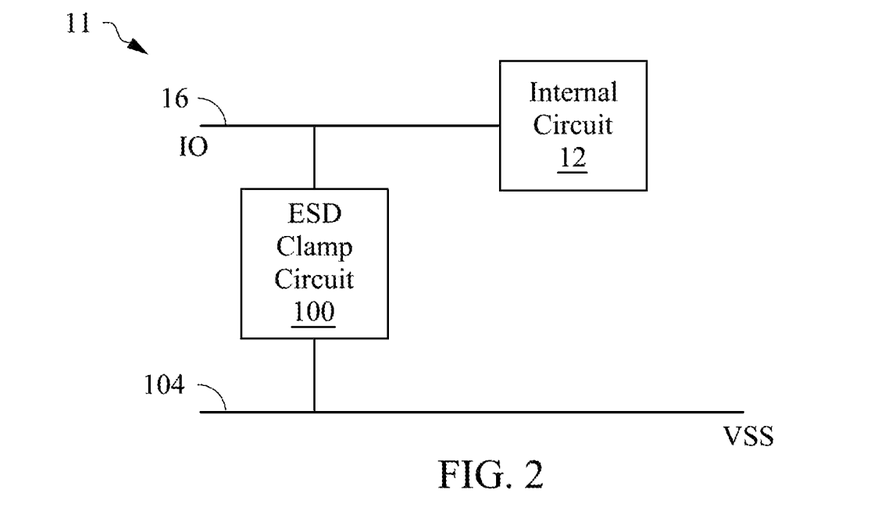
FIG. 2 is a block diagram illustrating another example IC including an ESD clamp circuit in accordance with some embodiments.

FIG. 2 illustrates another example integrated circuit device 11 in accordance with further disclosed examples. The illustrated example device 11 includes the internal circuit 12 connected to an I/O terminal 16. The IO circuit 14 is coupled between a first rail or terminal 102, with the ESD clamp circuit 100 (which will be described further below) coupled between the I/O terminal 16 and the second terminal 104 (e.g. ground) to selectively provide an ESD path during ESD events.

Figure 3:
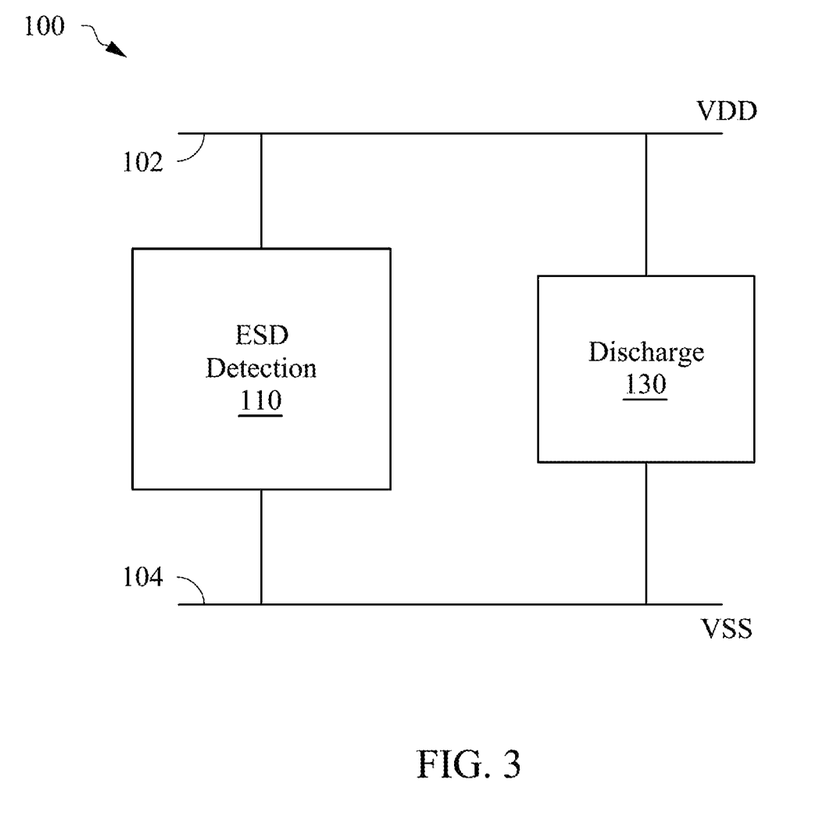
FIG. 3 is a block diagram illustrating an ESD clamp circuit in accordance with some embodiments.

FIG. 3 is a block diagram illustrating aspects of an example of the ESD clamp circuit 100 shown in FIG. 1 and FIG. 2. The example ESD clamp circuit 100 includes an ESD detection circuit 110 and a discharge circuit 130 connected between the first terminal 102 and second terminal 104. The ESD detection circuit 110 is configured to detect an ESD event, and a discharge circuit 130 provides an ESD discharge path between the first terminal 102 and second terminal 104 in response to the ESD detection circuit 110. As will be explained further below, the ESD clamp circuit 100 avoids use of a voltage divider for providing voltage bias for devices therein, thus eliminating the leakage associated with such a voltage divider.

Figure 4:
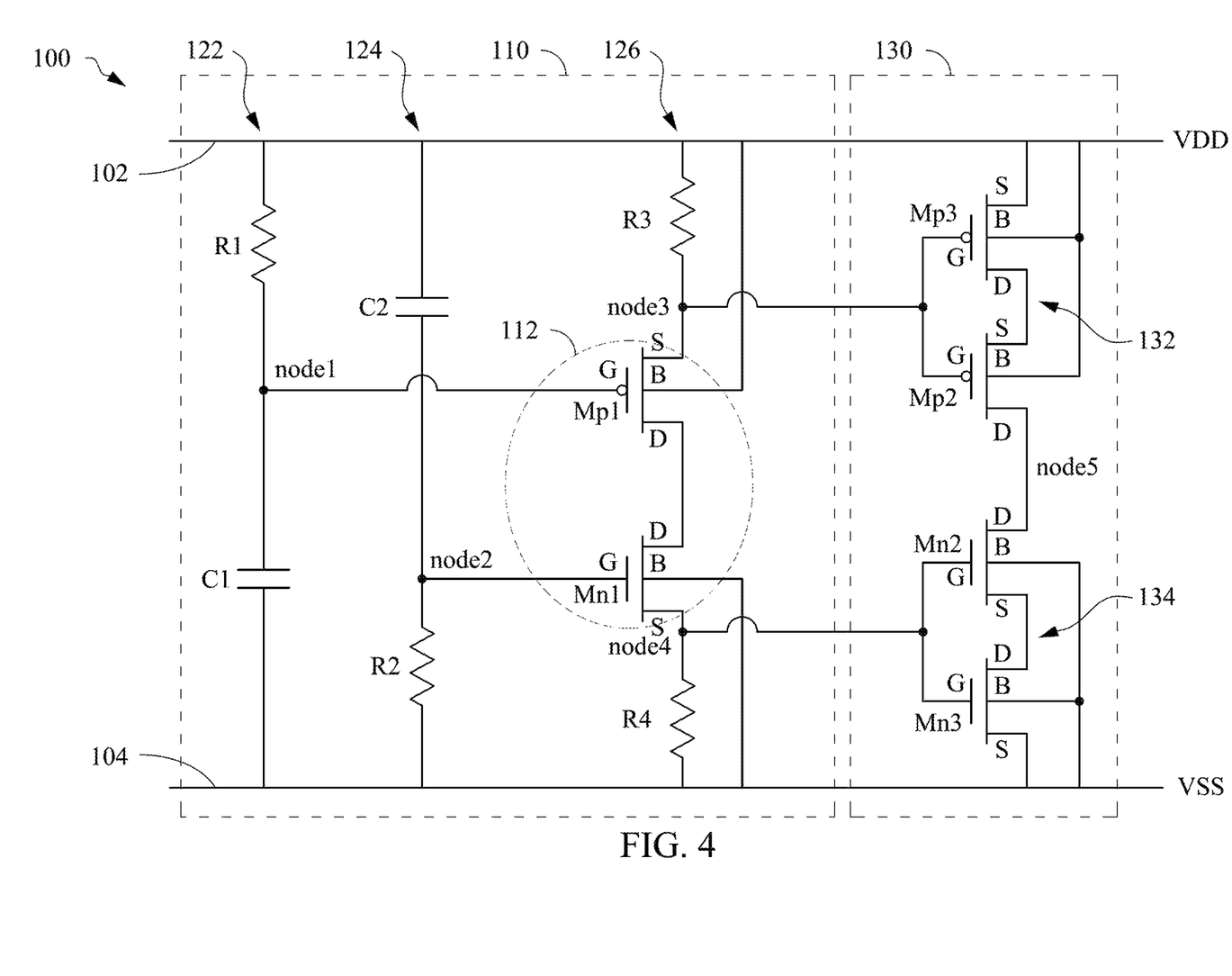
FIG. 4 is a schematic diagram illustrating an example ESD clamp circuit in a standby mode in accordance with some embodiments.
Figure 5:
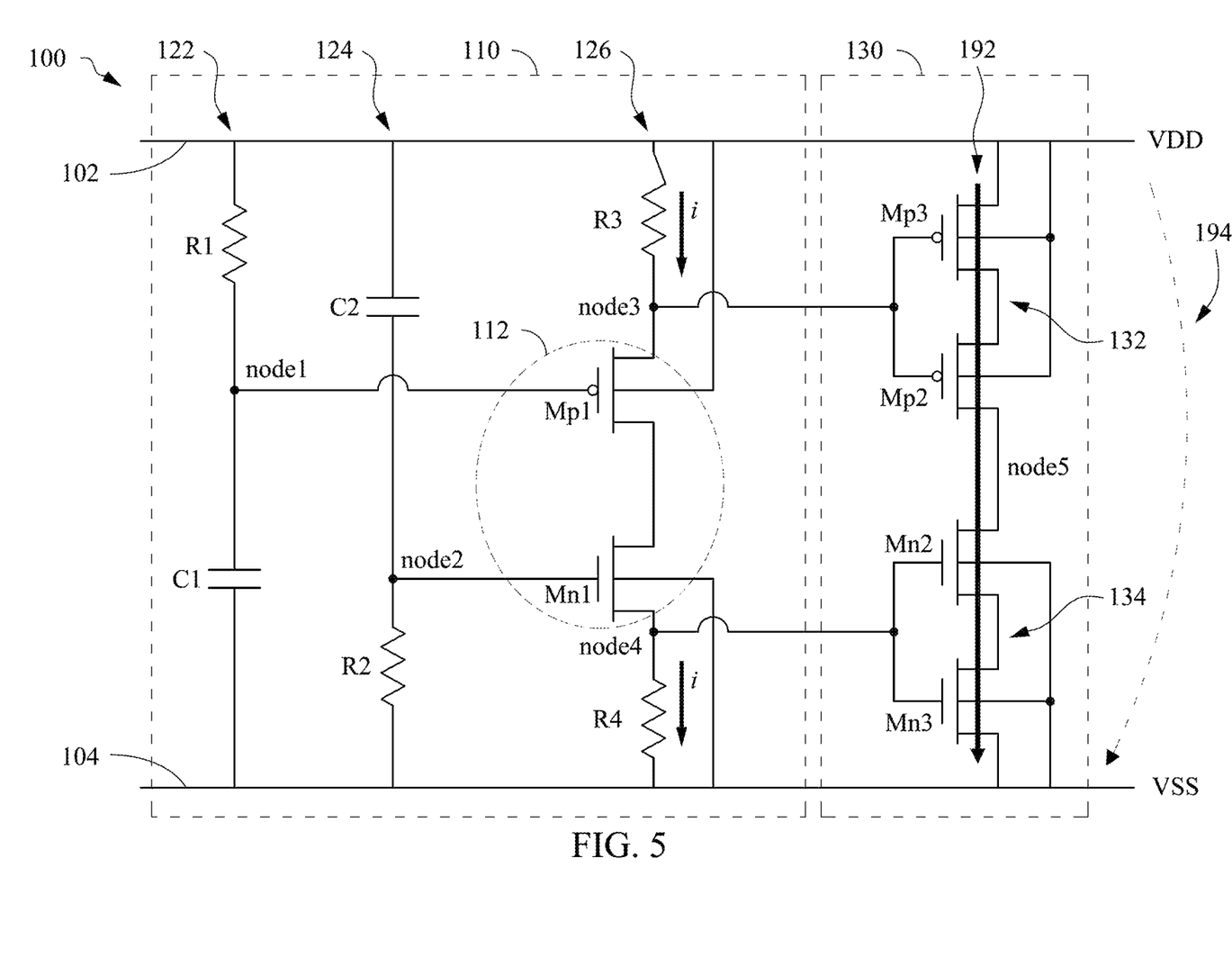
FIG. 5 is schematic a diagram illustrating the example ESD clamp circuit of FIG. 4 in an ESD mode in accordance with some embodiments.

FIG. 4 and FIG. 5 are schematic diagrams illustrating further aspects of an example of the ESD clamp circuit 100 shown in FIG. 3. FIG. 4 illustrates the ESD clamp circuit 100 in a standby mode, and FIG. 5 illustrates the ESD clamp circuit 100 of FIG. 4 in an ESD mode in accordance with some embodiments. In the example of FIG. 4, the ESD clamp circuit 100 includes, among other things, the ESD detection circuit 110 and the discharge circuit 130. The ESD clamp circuit 100 is coupled between the first terminal 102 and the second terminal 104. In the example of FIG. 4, the first terminal 102 receives a first voltage VDD, while the second terminal 104 receives a second voltage VSS. In the example of FIG. 4, VDD is higher than VSS, and in some examples VSS is ground. It should be noted that the ESD clamp circuit 100 may be coupled between two terminals in configurations other than that of FIG. 4, such as that shown in FIG. 2 discussed above.

In the example of FIG. 4, the ESD detection circuit 110 includes three branches 122, 124, and 126 in parallel between the first and second terminals 102 and 104. The first branch 122 includes a first resistor R1 and a first capacitor C1 connected in series. The first resistor R1 is connected to the first terminal 102, and the first capacitor C1 is connected to the second terminal 104. The second branch 124 includes a second resistor R2 and a second capacitor C2 connected in series. The second resistor R2 is connected to the second terminal 104, and the second capacitor C2 is connected to the first terminal 102. In the example of FIG. 4, the third branch 126 includes a third resistor R3, a p-type transistor Mp1, an n-type transistor Mn1, and a fourth resistor R4, connected in series. The third resistor R3 is connected to the first terminal 102, and the fourth resistor R4 is connected to the second terminal 104. The gate G of the transistor Mp1 is connected to a first node node1 formed at the junction of the first resistor R1 and the first capacitor C1. The gate G of the transistor Mn1 is connected to a second node node2 formed at a junction of the second resistor R2 and the second capacitor C2.

The discharge circuit 130 includes one or more p-type transistors connected in series (collectively referred to as a p-type transistor stack 132) and one or more n-type transistors connected in series (collectively referred to as a n-type transistor stack 134). In the example of FIG. 4, the p-type transistor stack 132 includes a p-type transistor Mp3 and a p-type transistor Mp2. It should be noted that the p-type transistor stack 132 may include other numbers (e.g., one, three, four, etc.) of p-type transistors, connected in series. Similarly, in the example of FIG. 4, the n-type transistor stack 134 includes a n-type transistor Mn3 and a n-type transistor Mn2. It should be noted that the n-type transistor stack 134 may include other numbers (e.g., one, three, four, etc.) of n-type transistors, connected in series. In examples disclosed herein, the transistors Mp1, Mp2, Mp3, Mn1, Mn2, and Mn3 are metal-oxide-semiconductor field-effect transistors (MOSFET) and thus referred to herein as transistors or "FETs."

In the example of FIG. 4, the bulk terminals B of the transistors Mp3 and Mp2 are connected to the first terminal 102, whereas the bulk terminals B of the transistors Mn2 and Mn3 are connected to the second terminal 104. In the example of FIG. 4, the gates G of the transistors Mp3 and Mp2 are connected to a third node node3 formed at the junction of the third resistor R3 and the transistor Mp1, whereas the gates G of the transistors Mn2 and Mn3 are connected to a fourth node node4 formed at a junction of the fourth resistor R4 and the transistor Mn1. The node3 and node4 nodes provide control signal outputs to the transistors of the discharge circuit 130 based on the state of the transistors Mp1 and Mn1. As such, these transistors are sometimes referred to as control transistors or FETs herein.

In the standby mode of the ESD clamp circuit 100 as shown in FIG. 4, node1 and node3 are charged to VDD, whereas node2 and node4 are charged to VSS. As a result, the transistors Mp1 and Mn1 in the ESD detection circuit 110 are both turned off, and the transistors Mp2, Mp3, Mn2, and Mn3 in the discharge circuit 130 are all turned off. As such, all the transistors in the ESD clamp circuit 100 are in off-state, and the ESD clamp circuit 100 has a high impedance in the standby mode.

Additionally, in the standby mode of the ESD clamp circuit 100 as shown in FIG. 4, the bulk terminals and the gates of the transistors Mp3 and Mp2 have the same voltage, which is VDD, therefore the transistors Mp3 and Mp2 are in a lowest-leakage-current state. As mentioned above, this applies to any number of p-type transistors in the p-type transistor stack 132.

Similarly, in the standby mode of the ESD clamp circuit 100 as shown in FIG. 4, the bulk terminals and the gates of the transistors Mn3 and Mn2 have the same voltage, which is VSS, therefore the transistors Mn3 and Mn2 are in a lowest-leakage-current state. As mentioned above, this applies to any number of n-type transistors in the n-type transistor stack 134.

Additionally, the transistors Mp1 and Mn1 are also in a lowest-leakage-current state for the same reasons. As such, each of the transistors in the ESD clamp circuit 100 is in its lowest-leakage-current, making the overall leakage current of the ESD clamp circuit 100 very small. Compared with conventional ESD clamp circuits where a voltage divider is used and at least one of the transistors in the discharge circuit is not in its lowest-leakage-current state, the overall leakage current of the ESD clamp circuit 100 in the standby mode is improved significantly.

Referring to FIG. 5, in the ESD mode, there is a fast transient ESD pulse on the first terminal 102. As a result, node1 is coupled to VSS and node2 is coupled to VDD. This causes the control transistors Mp1 and Mp2 to both operate in the on state, resulting in current flow in the third branch 126 of the detection circuit 110 and voltage drops across the resistors R3 and R4. As such, the voltages at node3 and node4 are between VSS and VDD, depending on the resistances of the third resistor R3 and the fourth resistor R4. In one example where the resistances of the third resistor R3 and the fourth resistor R4 are the same, the voltages at node3 and node4 are between VSS and VDD. In some examples, the voltages at node3 and node4 are determined according to (VDD+VS S)/2.

Because node3 is charged to a voltage lower than the voltages at the sources of the transistors Mp3 and Mp2 (i.e., $V_{SG}$ is higher than the threshold voltages of the transistors Mp3 and Mp2), the transistors Mp3 and Mp2 are turned on. Similarly, because node 4 is charged to a voltage higher than the voltages at the sources of the transistors Mn3 and Mn2 (i.e. $V_{GS}$ is higher than the threshold voltages of the transistors Mn3 and Mn2), the transistors Mn3 and Mn2 are turned on, therefore providing an ESD discharge path 192. In other words, the ESD path 192 shunts the transient ESD pulse in the ESD mode.

In some implementations, all transistors in the discharge circuit 130 (i.e. in the example of FIG. 4 and FIG. 5, the transistors Mp3, Mp2, Mn2, and Mn3) are bigFETs, each of which is a MOSFET transistor with a large channel width. In other words, the channel width of a bigFET is larger than a regular transistor in the ESD clamp circuit 100. In the example of FIG. 4 and FIG. 5, the width of any of the transistors Mp3, Mp2, Mn3, and Mn2 is larger than those of the transistors Mp1 and Mn1. In one example, the width of any of the transistors Mp3, Mp2, Mn3, and Mn2 is ten times larger than those of the transistors Mp1 and Mn1. In another example, the width of any of the transistors Mp3, Mp2, Mn3, and Mn2 is 100 times larger than those of the transistors Mp1 and Mn1. In yet another example, the width of any of the transistors Mp3, Mp2, Mn3, and Mn2 is 1000 times larger than those of the transistors Mp1 and Mn1. Other widths of the transistors Mp3, Mp2, Mn3, and Mn2 relative to the transistors Mp1 and Mn1 are within the scope of the disclosure. Because of the larger-than-regular width, the on-state resistance of those transistors Mp3, Mp2, Mn3, and Mn2 are smaller than regular transistors in the ESD clamp circuit 100, and therefore shunts the transient ESD pulse to a greater extent in the ESD mode.

In addition to the ESD path 192, the ESD clamp circuit 100 further includes another ESD path, namely the ESD path 194 denoted as dash line in FIG. 5. In the ESD mode, a parasitic P-N-P-N silicon-controlled rectifier (SCR) is turned on and serves as the additional ESD path. Details of the ESD path 194 are described further below.

Figure 6:
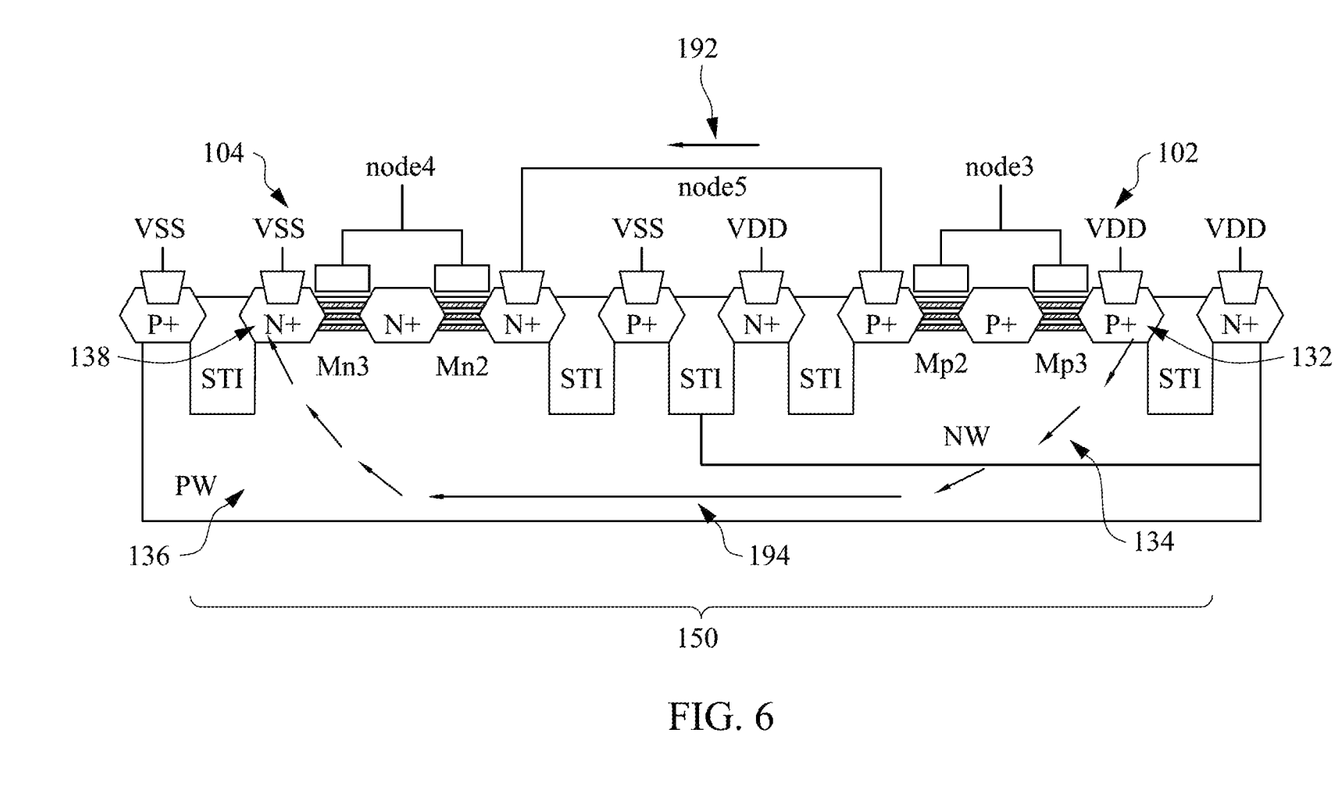
FIG. 6 is a schematic cross-sectional diagram illustrating two ESD paths in the ESD clamp circuit of FIG. 2 in accordance with some embodiments.

FIG. 6 is a schematic cross-sectional diagram illustrating two ESD paths 192 and 194 in the ESD clamp circuit 100 of FIG. 5 in accordance with some embodiments. In the example of FIG. 6, the transistors Mp3 and Mp2 are fabricated in a n-type well 134, whereas the transistors Mn3 and Mn2 are fabricated in the p-type well 136. The ESD path 192 is a path from the source 132 of the transistor Mp3, which is connected to the first terminal 102, through the transistors Mp3, Mp2, node 5, Mn2, and Mn3 in turn, to the source 138 of the transistor Mn3, which is connected to the second terminal 104.

In the example of FIG. 6, the transistors Mp3, Mp2, Mn3, and Mn2 are nanosheet FETs. A nanosheet FET refers to a type of FET that includes a plurality of stacked nanosheets extending between a pair of source/drain epitaxial (EPI) regions formed on an active region which may include an oxide layer or oxide diffusion (OD). The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

FETs typically include doped source/drain epitaxial regions that are formed in a semiconductor substrate and separated by a channel region. A gate insulation layer is positioned above the channel region and a conductive gate electrode is positioned above the gate insulation layer. The source/drain EPI regions may be doped with N-type dopants and/or P-type dopants. For example, the an N-type Epitaxy (N-EPI) may be provided for forming N+ source/drain regions for the N-type FETs, while a P-type EPI (N-EPI) may be provided for forming P+ source/drain regions for the P-type FETs. The conductive gate electrodes MG are formed by a conductive material such as metal or polysilicon (PO). The gate insulation layer and the gate electrode together may be referred to as the "gate stack," "gate structure," etc., for the device. The various first and second terminals (i.e. VDD and VSS terminals) are separated from one another and from the source/drain regions of the various FETs by shallow trench isolations (STI).

Figure 7:
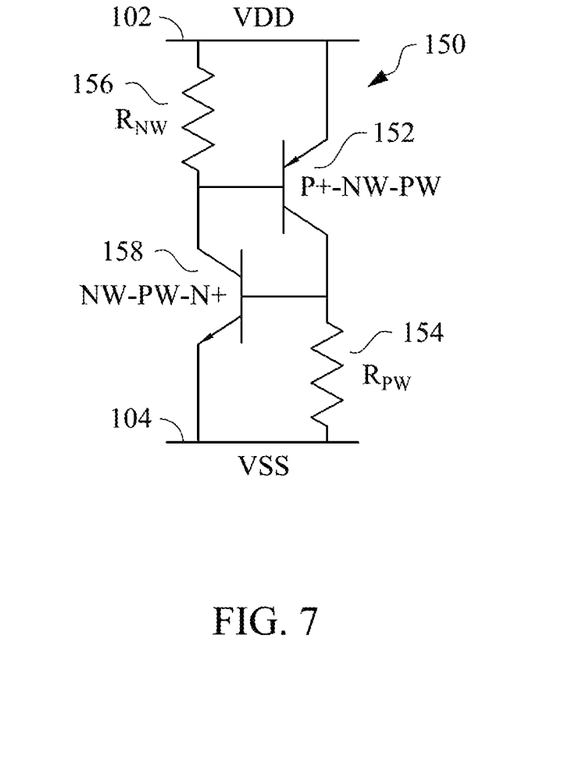
FIG. 7 is a schematic diagram conceptually illustrating an example of a parasitic silicon-controlled rectifier (SCR) in accordance with some embodiments.

As shown in FIG. 6, the transistor structure defines an NMOS and PMOS junction at the n-type well 134 and the p-type well 136. A parasitic structure 150 is formed between the first terminal 102 and the second terminal 104. FIG. 7 conceptually illustrates aspects of the parasitic structure 150. More particularly, the parasitic structure 150 is a parasitic P-N-P-N structure formed between the first terminal 102 and the second terminal 104, which includes the source 132 of the transistor Mp3, the n-type well 134, the p-type well 136, and the source 138 of the transistor Mn3. As such, the P-N-P-N parasitic structure 150 is equivalent to an SCR, which is a P-N-P-N structure that acts as a PNP and an NPN bipolar transistor stacked next to each other as shown in FIG. 7. In FIG. 7, the P+ source 132 of the transistor Mp3, the n-type well 134, and the p-type well 136 form a parasitic PNP bipolar transistor 152 in series with the resistance of the p-type well 136 (represented by a resistor 154) between the first and second terminals 102 and 104. Similarly, a parasitic NPN transistor 156 is formed by the n-type well 134, the p-type well 136, and the N+ source 138 of the transistor Mn3. The parasitic NPN transistor 156 is series with the resistance of the n-type well 134 (represented by a resistor 156) between the first and second terminals 102 and 104. The base of the parasitic PNP transistor 152 is connected to the collector of the parasitic NPN transistor 158, which has its base connected to the collector of the parasitic PNP transistor 152. In the ESD mode, the parasitic P-N-P-N SCR 150 serves as the second ESD path 194, therefore shunting the transient ESD pulse as well.

As noted above, in the example of FIG. 6, the transistors Mp3, Mp2, Mn3, and Mn2 are nanosheet FETs. It should be noted that the transistors in the ESD clamp circuit 100 may include types of transistors other than those shown in the illustrated example, such as planar MOSFETs, FinFETs, and the like. It should be noted that the capacitors in the ESD clamp circuit 100 also may include any suitable capacitor structures, such as metal-insulator-metal (MIM) capacitors, metal-oxide-metal (MOM) capacitors, metal oxide semiconductor (MOS) capacitors, and the like. Similarly, the resistors in the ESD clamp circuit 100 may be any types of resistors as needed, such as metal resistors, poly layer resistors (i.e., "poly resistors"), MOS resistors, and the like.

Figure 8:
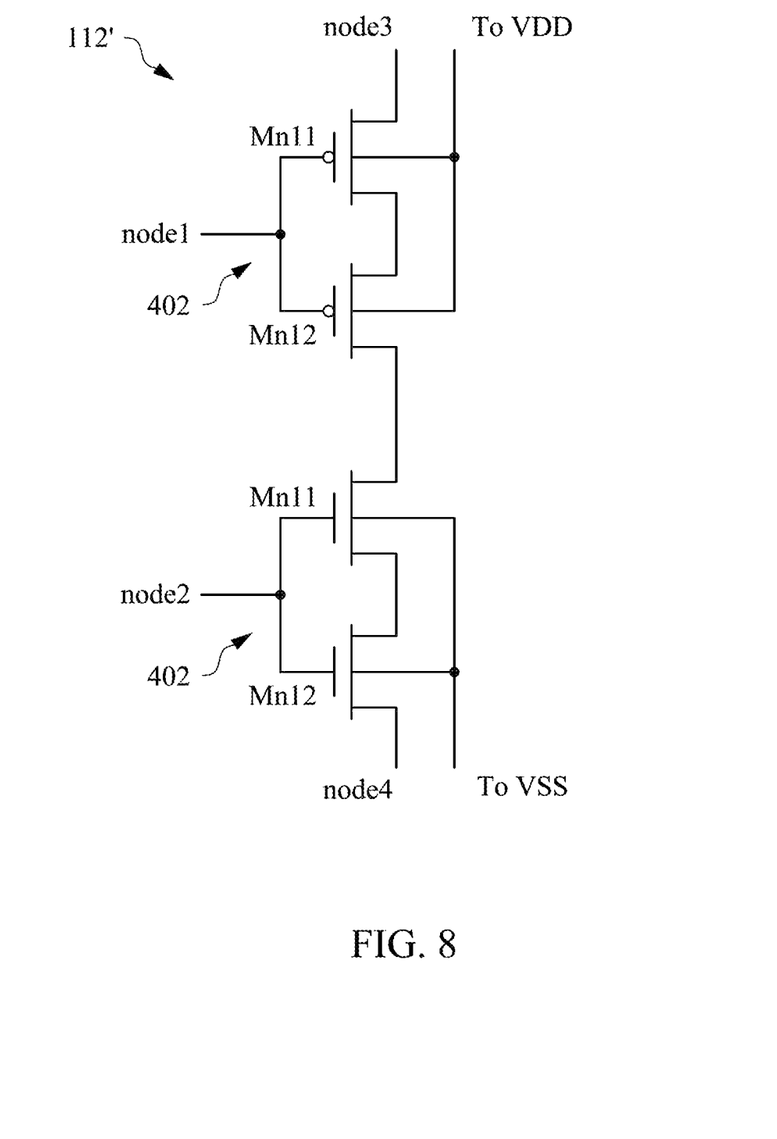
FIG. 8 is a schematic diagram of an alternative arrangement of the region 112 of FIG. 4 in accordance with some embodiments.

FIG. 8 is a diagram of an alternative arrangement 112' of the region 112 of FIG. 4 in accordance with some embodiments. As noted above, the region 112 shown in FIG. 4 includes the transistor Mp1 and Mn1. In the example of FIG. 8, this region 112 of FIG. 4 is replaced with the alternative arrangement 112'. The alternative arrangement 112' includes a p-type transistor stack 402 and a n-type transistor stack 404. The p-type transistor stack 402 includes two (it should be noted that other numbers are within the scope of the disclosure) p-type transistors Mp11 and Mp12 connected in series. Likewise, the n-type transistor stack 404 includes two (it should be noted that other numbers are within the scope of the disclosure) n-type transistors Mn11 and Mn12 connected in series. As such, the leakage current of the ESD detection circuit 110 could be further reduced compared with the example of FIG. 4.

Figure 9:
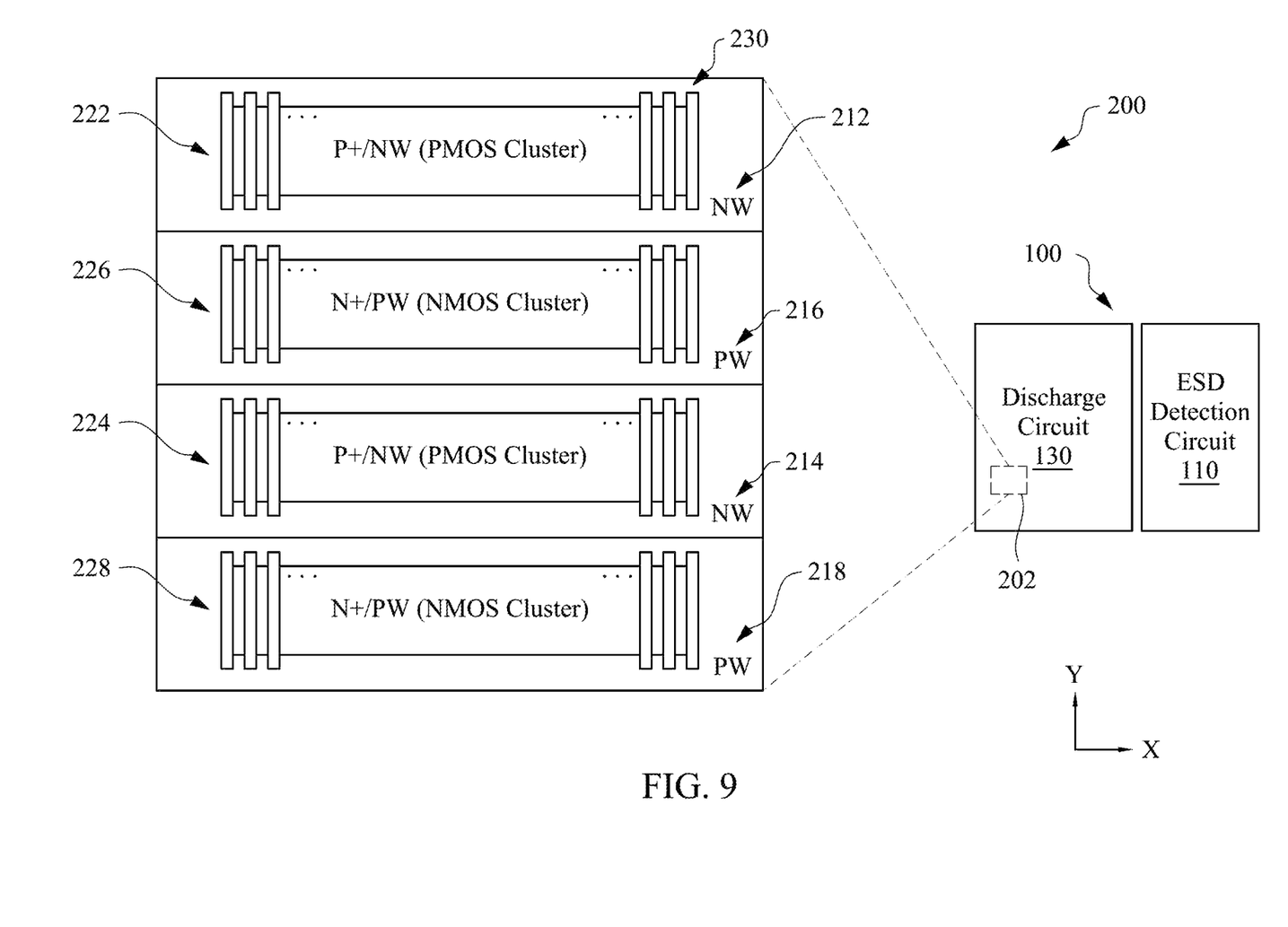
FIG. 9 is an example layout of the ESD clamp circuit in accordance with some embodiments.

FIG. 9 is an example layout 200 of the ESD clamp circuit 100 in accordance with some embodiments. In the example of FIG. 9, a region 202 of the layout of the discharge circuit 130 includes n-type wells 212 and 214 and p-type wells 216 and 218, interposed in the Y direction. In the n-type wells 212 and 214, there are p-type transistor clusters 222 and 224 including a number of p-type transistors connected in series such as the p-type transistors Mp2 and Mp3 discussed above. In one implementation, the channel width of the p-type transistors cluster 222 and/or 224 is larger than a regular transistor (i.e., they are bigFETs as disclosed above).

On the other hand, there are n-type transistor clusters 226 and 228, including a number of n-type transistors connected in series such as the n-type transistors Mn2 and Mn3 discussed above, in the p-type wells 216 and 218. In one implementation, the channel width of the n-type transistors cluster 226 and/or 228 is larger than a regular transistor (i.e., they are bigFETs).

A plurality of conductive gate strips 230 extend in the Y direction to provide the connections of the p-type transistor clusters 222 and 224 and the n-type transistor clusters to node3 or node4 as appropriate. For instance, for the embodiment shown in FIG. 5, the gate strips 230 connect the transistors of the p-type transistor clusters 222 and 224 to node3, and the transistors of the n-type transistor clusters 226 and 228 to node4.

Since the n-type wells 212 and 214 and p-type wells 216 and 218 are interposed in the Y direction, there are three parasitic SCRs therebetween formed by the multiple P-N junctions, therefore creating multiple ESD paths for shunting the transient ESD pulse.

Figure 10:
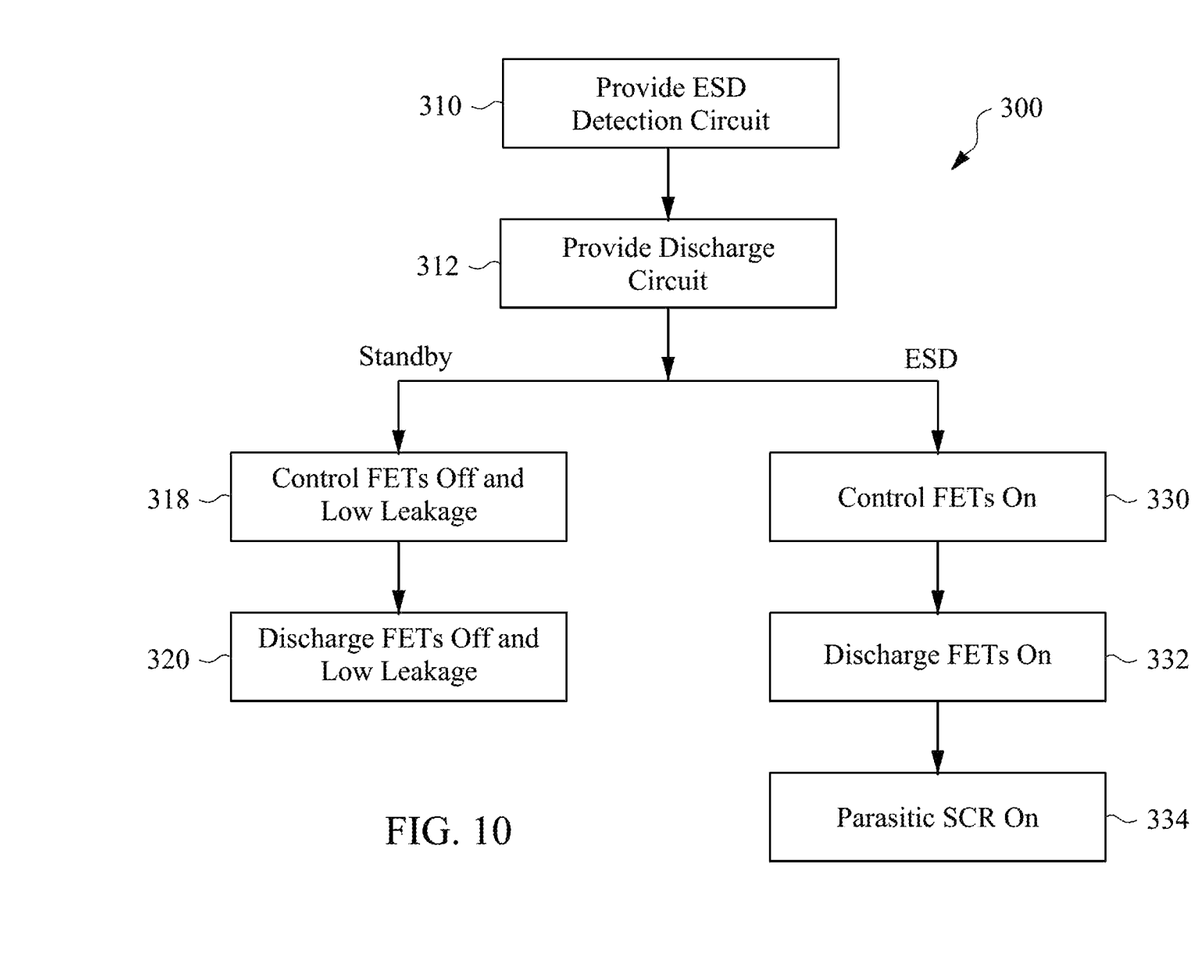
FIG. 10 is a flow diagram illustrating an example of an ESD protection method in accordance with some embodiments.

FIG. 10 illustrates an ESD protection method 300 in accordance with some examples. Referring to the flow diagram of FIG. 10 together with FIG. 4 and FIG. 5 discussed above. At an operations 310 and 312, ESD detection and discharge circuits such as the circuits 110 and 130, respectively, are provided. As discussed above in con as discussed above in conjunction with FIG. 4 and FIG. 5, the ESD detection circuit 110 has a first control transistor Mp1 and a second control transistor Mn1 connected in series between the first terminal 102 and the second terminal 104. In some examples the first terminal 102 is a VDD terminal and the second terminal 104 is a VSS terminal. The discharge circuit 130 has a p-type discharge transistor Mp3 and an n-type discharge transistor Mn2 connected in series between the first terminal 102 and the second terminal 104.

In a standby mode, the gates of the control transistors Mp1 and Mn1 are biased to turn the control transistors Mp1 and Mn1 off, and to place them in a low leakage state in operation 318. As discussed above, biasing the control transistors Mp1 and Mn1 using the series-connected resistors and capacitor circuits (i.e. R1-C1 and C2-R2) to bias the control transistors Mp1 and Mn1 rather than a voltage divider results in less leakage and reduced chip area. In operation 320, the discharge transistors Mp3 and Mn2 are also in an off and low leakage state based on the control transistors Mp1 and Mn1 being off. As such, all of the transistors in the ESD detection circuit 110 and the discharge circuit 130 are off in the standby mode.

In an ESD discharge mode shown in FIG. 10, the first control transistor Mp1 and the second control transistor Mn1 are turned on in response to an ESD pulse at operation 330. This results in current flow in the third branch 126 of the detection circuit 110 and corresponding voltage drops across the resistors R3 and R4. As such, the p-type discharge transistor Mp2/Mp3 and the n-type discharge transistor Mn2/Mn3 turn on at operation 332. More particularly, the discharge transistors turn on in response to the respective control signals output by the first control transistor Mp1 and the second control transistor Mn1 at node3 and node 4. This form the first ESD discharge path 192. Further, the parasitic P-N-P-N SCR turns on at operation 334 in response to the ESD pulse to form the second ESD discharge path 194, which is in parallel with the first ESD discharge path 192.

Thus, aspects of the disclosure provide an ESD clamp circuit that avoids the use of voltage dividers for biasing transistors in the circuit. This eliminates the voltage leakage associated with such voltage dividers. Further, the resistors R3 and R4 together with the control transistors Mp1 and Mp2 to establish voltage drops provides a reliable bias voltage for the gates of the discharge transistors Mp2, Mp3, Mn2, and Mn3. Moreover, providing an additional ESD discharge path 194 with the parasitic SCR 194 provides lower turn on resistance for the ESD discharge.

Disclosed embodiments include an ESD detection circuit that includes a first resistor and a first capacitor connected in series between a first terminal and a second terminal. A junction of the first resistor and the first capacitor forms a first node. A second resistor and a second capacitor are connected in series between the first terminal and the second terminal, and a junction of the second resistor and the second capacitor forms a second node. A third resistor is connected to the first terminal and a fourth resistor is connected to the second terminal. A p-type transistor and an n-type transistor are connected in series between the third resistor and the fourth resistor. A gate of the p-type transistor is connected to the first node, and a gate of the n-type transistor is connected to the second node.

In accordance with further disclosed embodiments, an ESD clamp circuit has an ESD detection circuit connected between a first terminal and a second terminal, with a first output node and a second output node. The ESD detection circuit is configured to output respective first and second control signals at the first and second output nodes in response to an ESD event. A discharge circuit includes a p-type transistor having a source, a drain and a gate, with the gate connected to the first output node. An n-type transistor has a source, a drain and a gate, with the gate connected to the second output node. The drain is connected to the drain of the p-type transistor. The discharge circuit is configured to establish a first ESD discharge path from the first terminal, through the p-type transistor and the n-type transistor, to the second terminal, and to further establish a second ESD discharge path in parallel with the first ESD discharge path. The second ESD discharge path includes a parasitic silicon controlled rectifier (SCR).

In accordance with still further disclosed embodiments, an ESD protection method includes providing an ESD detection circuit having a first control transistor and a second control transistor connected in series between a first terminal and a second terminal, and providing a discharge circuit having a p-type discharge transistor and an n-type discharge transistor connected in series between the first terminal and the second terminal. In a standby mode, the first control transistor and the second control transistor are turned off and to a low leakage state, and the p-type discharge transistor and the n-type discharge transistor are turned off and to a low leakage state. In an ESD detection mode, the first control transistor and the second control transistor are turned on in response to an ESD pulse. The p-type discharge transistor and the n-type discharge transistor are turned on in response to respective control signals output by the first control transistor and the second control transistor to form a first ESD discharge path. A parasitic P-N-P-N SCR is also turned on in response to the ESD pulse to form a second ESD discharge path in parallel with the first ESD discharge path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) detection circuit, comprising:
    a first resistor and a first capacitor connected in series between a first terminal and a second terminal, a junction of the first resistor and the first capacitor forming a first node;
    a second resistor and a second capacitor connected in series between the first terminal and the second terminal, a junction of the second resistor and the second capacitor forming a second node;
    a third resistor connected to the first terminal;
    a fourth resistor connected to the second terminal; and
    a p-type transistor and an n-type transistor connected in series between the third resistor and the fourth resistor, wherein a gate of the p-type transistor is connected to the first node, and a gate of the n-type transistor is connected to the second node.

2. The ESD detection circuit of claim 1, wherein the first resistor is connected to the first terminal and the first capacitor is connected to the second terminal.

3. The ESD detection circuit of claim 2, wherein the second resistor is connected to the second terminal and the second capacitor is connected to the first terminal.

4. The ESD detection circuit of claim 2, wherein the third resistor is connected between a source of the p-type transistor and the first terminal.

5. The ESD detection circuit of claim 2, wherein the fourth resistor is connected between a source of the n-type transistor and the second terminal.

6. The ESD detection circuit of claim 1, wherein the p-type transistor includes a bulk terminal connected to the first terminal and the n-type transistor includes a bulk terminal connected to the second terminal.

7. The ESD detection circuit of claim 1, further comprising:
    a plurality of p-type transistors including the p-type transistor, the plurality of p-type transistors connected in series;
    a plurality of n-type transistors including the n-type transistor, the plurality of n-type transistors connected in series; and
    wherein a gate of each of the p-type transistors is connected to the first node and a gate of each of the n-type transistors is connected to the second node.

8. The ESD detection circuit of claim 1, wherein the first terminal is configured to receive a VDD voltage and the second terminal is configured to receive VSS voltage.

9. The ESD detection circuit of claim 1, wherein the p-type transistor and the n-type transistor are both configured to turn on in response to an ESD pulse.

10. The ESD detection circuit of claim 1, wherein the p-type transistor and the n-type transistor are both configured to be off and in a low leakage state in a standby mode.

11. An electrostatic discharge (ESD) clamp circuit, comprising:
    an ESD detection circuit connected between a first terminal and a second terminal and having a first output node and a second output node, the ESD detection circuit configured to output respective first and second control signals at the first and second output nodes in response to an ESD event, wherein the ESD detection circuit comprises:
        a first resistor and a first capacitor connected in series between the first terminal the second terminal, a junction of the first resistor and the first capacitor forming a first control nodes;
        a second resistor and a second capacitor connected in series between the first terminal and the second terminal, a junction of the second resistor and the second capacitor forming a second control;
        a third resistor connected to the first terminal;
        a fourth resistor connected to the second terminals; and
        a p-type control transistor and a n-type control transistor connected in series be ween the third resistor and the fourth resistor; and
    a discharge circuit, comprising:
        a p-type discharge transistor having a source, a drain and a gate, the gate connected to the first output node;
        an n-type discharge transistor having a source, a drain and a gate, the gate connected to the second output node, the drain connected to the drain of the p-type discharge transistor;
        wherein the discharge circuit is configured to establish a first ESD discharge path from the first terminal, through the p-type discharge transistor and the n-type discharge transistor, to the second terminal; and
        wherein the discharge circuit is configured to establish a second ESD discharge path in parallel with the first ESD discharge path, the second ESD discharge path including a parasitic silicon controlled rectifier (SCR).

12. The ESD clamp circuit of claim 11, further comprising:
- a plurality of the p-type discharge transistors including the p-type discharge transistor, each of the p-type discharge transistors having a gate connected to the first output node; and
- a plurality of the n-type discharge transistors including the n-type discharge transistor, each of the n-type discharge transistors having a gate connected to the second output node.

13. The ESD clamp circuit of claim 11, wherein a source of the p-type discharge transistor is connected to the first terminal and a source of the n-type discharge transistor is connected to the second terminal.

14. The ESD clamp circuit of claim 11, wherein the p-type discharge transistor includes a bulk terminal connected to the first terminal and the n-type discharge transistor includes a bulk terminal connected to the second terminal.

15. The ESD clamp circuit of claim 11,
- wherein a gate of the p-type control transistor is connected to the first control node, and a gate of the n-type control transistor is connected to the second output node;
- wherein a junction of the third resistor and the p-type control transistor form the first output node; and
- wherein a junction of the fourth resistor and the n-type control transistor form the second output node.

16. The ESD clamp circuit of claim 15, wherein the first resistor is connected to the first terminal and the first capacitor is connected to the second terminal, and wherein the second resistor is connected to the second terminal and the second capacitor is connected to the first terminal.

17. The ESD clamp circuit of claim 15, wherein the ESD detection circuit further comprises:
- a plurality of p-type control transistors including the p-type control transistor, the plurality of p-type control transistors connected in series;
- a plurality of n-type control transistors including the n-type control transistor, the plurality of n-type control transistors connected in series; and
- wherein a gate of each of the p-type transistors is connected to the first control node and a gate of each of the n-type transistors is connected to the second output node.

18. A method, comprising:
- providing an ESD detection circuit having a first control transistor and a second control transistor connected in series between a first terminal and a second terminal;
- providing a discharge circuit having a p-type discharge transistor and an n-type discharge transistor connected in series between the first terminal and the second terminal,
- in a standby mode:
  - turning the first control transistor and the second control transistor off and to a low leakage state;
  - turning the p-type discharge transistor and the n-type discharge transistor off and to a low leakage state;
- in an ESD detection mode:
  - turning the first control transistor and the second control transistor on in response to an ESD pulse;
  - turning the p-type discharge transistor and the n-type discharge transistor on in response to respective control signals output by the first control transistor and the second control transistor; and
  - turning on a parasitic P-N-P-N silicon-controlled rectifier (SCR) in response to the ESD pulse.

19. The method of claim 18, wherein the first control transistor is a p-type transistor and the second control transistor is an n-type transistor, and wherein turning the first control transistor and the second control transistor off and to a low leakage state includes charging a gate of the first control transistor to a VDD voltage level and charging a gate of the second control transistor to a VSS voltage level.

20. The method of claim 19, wherein:
- the first terminal is configured to receive a VDD voltage;
- the second terminal is configured to receive a VSS voltage;
- charging the gate of the first control transistor to the VDD voltage level includes connecting the gate of the first control transistor to a first resistive/capacitive circuit including a first resistor and a first capacitor connected in series between the first terminal and the second terminal; and
- charging the gate of the second control transistor to the VSS voltage level includes connecting the gate of the second control transistor to a second resistive/capacitive circuit including a second resistor and a second capacitor connected in series between the first terminal and the second terminal.

* * * * *